(12) United States Patent
Fukuzumi et al.

(10) Patent No.: US 10,090,315 B2
(45) Date of Patent: Oct. 2, 2018

(54) SEMICONDUCTOR MEMORY DEVICE IN WHICH AN ARRAY CHIP INCLUDING THREE-DIMENSIONALLY DISPOSED MEMORY CELLS BONDED TO A CONTROL CIRCUIT CHIP

(71) Applicant: Toshiba Memory Corporation, Minato-ku (JP)

(72) Inventors: Yoshiaki Fukuzumi, Yokkaichi (JP); Hideaki Aochi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/388,318

(22) Filed: Dec. 22, 2016

(65) Prior Publication Data

US 2017/0103994 A1 Apr. 13, 2017

Related U.S. Application Data

(63) Continuation of application No. 14/806,034, filed on Jul. 22, 2015, now Pat. No. 9,558,945.

(30) Foreign Application Priority Data

Sep. 12, 2014 (JP) ................. 2014-186684

(51) Int. Cl.
*H01L 27/11563* (2017.01)
*H01L 27/11575* (2017.01)
(Continued)

(52) U.S. Cl.
CPC .. *H01L 27/11573* (2013.01); *H01L 21/76898* (2013.01); *H01L 27/11568* (2013.01); *H01L 27/11582* (2013.01)

(58) Field of Classification Search
CPC ............ H01L 21/185; H01L 21/76898; H01L 21/8247; H01L 23/522; H01L 23/5226;
(Continued)

(56) References Cited

U.S. PATENT DOCUMENTS 7,623,384 B2  11/2009  Iwata
7,936,004 B2   5/2011  Kito et al.
(Continued)

FOREIGN PATENT DOCUMENTS

JP  2002-110907 A  4/2002
JP  2009-146954 A  7/2009
(Continued)

*Primary Examiner* — Marc Armand
*Assistant Examiner* — Younes Boulghassoul
(74) *Attorney, Agent, or Firm* — Oblon, McClelland, Maier & Neustadt, L.L.P.

(57) ABSTRACT

According to one embodiment, the array chip includes a three-dimensionally disposed plurality of memory cells and a memory-side interconnection layer connected to the memory cells. The circuit chip includes a substrate, a control circuit provided on the substrate, and a circuit-side interconnection layer provided on the control circuit and connected to the control circuit. The circuit chip is stuck to the array chip with the circuit-side interconnection layer facing to the memory-side interconnection layer. The bonding metal is provided between the memory-side interconnection layer and the circuit-side interconnection layer. The bonding metal is bonded to the memory-side interconnection layer and the circuit-side interconnection layer.

14 Claims, 10 Drawing Sheets

(51) Int. Cl.
*H01L 27/11568* (2017.01)
*H01L 27/11573* (2017.01)
*H01L 27/11582* (2017.01)
*H01L 21/768* (2006.01)

(58) Field of Classification Search
CPC ....... H01L 25/065; H01L 25/07; H01L 25/18; H01L 27/11573; H01L 27/11582; H01L 27/11568; H01L 27/11526; H01L 27/11556; H01L 27/1157; H01L 29/792; H01L 29/788; G11C 5/025
USPC ....... 257/324, 326, 314, 350, 347, 351, 390, 257/391, E29.309, E21.409, E27.011, 257/E27.026, E27.027, E29.17, E29.286, 257/E29.308; 438/261
See application file for complete search history.

(56) References Cited

U.S. PATENT DOCUMENTS

| | | | |
|---|---|---|---|
| 8,044,448 B2 | 10/2011 | Kamigaichi et al. | |
| 8,288,816 B2* | 10/2012 | Komori | H01L 27/11573 257/324 |
| 8,338,882 B2* | 12/2012 | Tanaka | H01L 27/11575 257/324 |
| 8,372,720 B2 | 2/2013 | Fukuzumi et al. | |
| 8,476,708 B2 | 7/2013 | Fukuzumi et al. | |
| 9,634,023 B2* | 4/2017 | Lee | H01L 27/11582 |
| 2010/0207195 A1 | 8/2010 | Fukuzumi et al. | |
| 2010/0320526 A1* | 12/2010 | Kidoh | H01L 23/522 257/324 |
| 2012/0181602 A1* | 7/2012 | Fukuzumi | H01L 27/0688 257/326 |
| 2015/0129878 A1* | 5/2015 | Shin | H01L 27/11578 257/66 |
| 2015/0340366 A1* | 11/2015 | Lim | G11O 5/025 257/401 |
| 2016/0005781 A1* | 1/2016 | Lin | H01L 27/14643 257/292 |
| 2016/0233264 A1 | 8/2016 | Kagawa | |

FOREIGN PATENT DOCUMENTS

| | | |
|---|---|---|
| JP | 2011-54758 A | 3/2011 |
| JP | 2011-187794 A | 9/2011 |
| JP | 2011-204829 | 10/2011 |
| JP | 2011-204829 A | 10/2011 |
| JP | 2012-146861 A | 8/2012 |
| JP | 2013-524550 A | 6/2013 |
| JP | 2014-11192 A | 1/2014 |

* cited by examiner

SEMICONDUCTOR MEMORY DEVICE IN WHICH AN ARRAY CHIP INCLUDING THREE-DIMENSIONALLY DISPOSED MEMORY CELLS BONDED TO A CONTROL CIRCUIT CHIP

CROSS-REFERENCE TO RELATED APPLICATION

This application is a continuation of and claims the benefit of priority under 35 U.S.C. § 120 from U.S. Ser. No. 14/806,034 filed Jul. 22, 2015, and claims the benefit of priority under 35 U.S.C. § 119 from Japanese Patent Application No. 2014-186684 filed Sep. 12, 2014; the entire contents of each of which are incorporated herein by reference.

FIELD

Embodiments described herein relate generally to a semiconductor memory device and a method for manufacturing a semiconductor memory device.

BACKGROUND

A memory device having a three-dimensional structure has been proposed. In the memory device, a memory hole is formed in a stacked body including a plurality of electrode layers stacked via insulating layers. The electrode layers function as control gates in memory cells. A silicon body functioning as a channel is provided on the sidewall of the memory hole via a charge storage film.

In order to reduce a space factor of a control circuit of a three-dimensional memory array in a chip, there has also been proposed a technique for providing the control circuit right under the array. For example, a configuration is proposed in which bit lines are connected to transistors formed on a substrate, via contact plugs formed at an array end portion and a bit line extension layer provided on the lower side of a memory array.

Therefore, a fine interconnection layer equivalent to the bit lines is also necessary under the array. A region around the array is necessary in order to form a deep contact. Further, there is a concern about a problem in that, for example, the bit lines are substantially long, a bit line capacity increase, and operation speed is affected.

DETAILED DESCRIPTION

Figure 1:
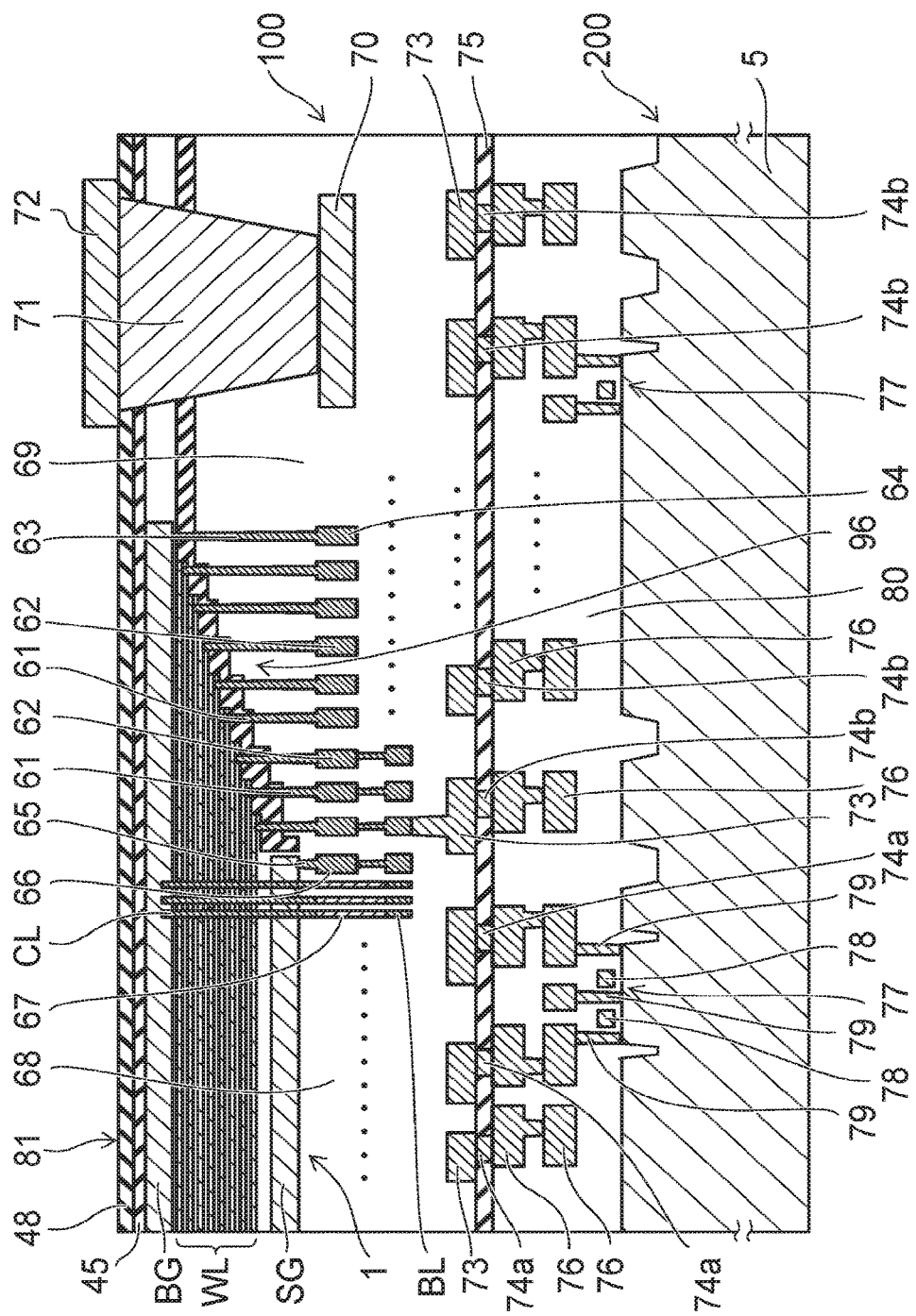
FIG. 1 is a schematic sectional view of a semiconductor memory device of an embodiment.

According to one embodiment, a semiconductor memory device includes an array chip, a circuit chip, a bonding metal, a pad, and an external connection electrode. The array chip includes a three-dimensionally disposed plurality of memory cells and a memory-side interconnection layer connected to the memory cells. The array chip does not include a substrate. The circuit chip includes a substrate, a control circuit provided on the substrate, and a circuit-side interconnection layer provided on the control circuit and connected to the control circuit. The circuit chip is stuck to the array chip with the circuit-side interconnection layer facing to the memory-side interconnection layer. The bonding metal is provided between the memory-side interconnection layer and the circuit-side interconnection layer. The bonding metal is bonded to the memory-side interconnection layer and the circuit-side interconnection layer. The pad is provided in the array chip. The external connection electrode reaches the pad from a surface side of the array chip.

Embodiments are described below with reference to the drawings. Note that, in the figures, the same components are denoted by the same reference numerals and signs.

FIG. 1 is a schematic sectional view of a semiconductor memory device of an embodiment.

The semiconductor memory device of the embodiment has a structure in which an array chip 100 including a three-dimensionally disposed plurality of memory cells and a circuit chip 200 including a control circuit that controls writing, erasing, and readout of data for a memory cell are stuck together.

As described below, after an array wafer and a circuit wafer are stuck together wafer-to-wafer, a wafer bonded body is diced and singulated into chips.

First, the array chip 100 is described. The array chip 100 includes a memory cell array 1 of a three-dimensional structure.

Figure 3:
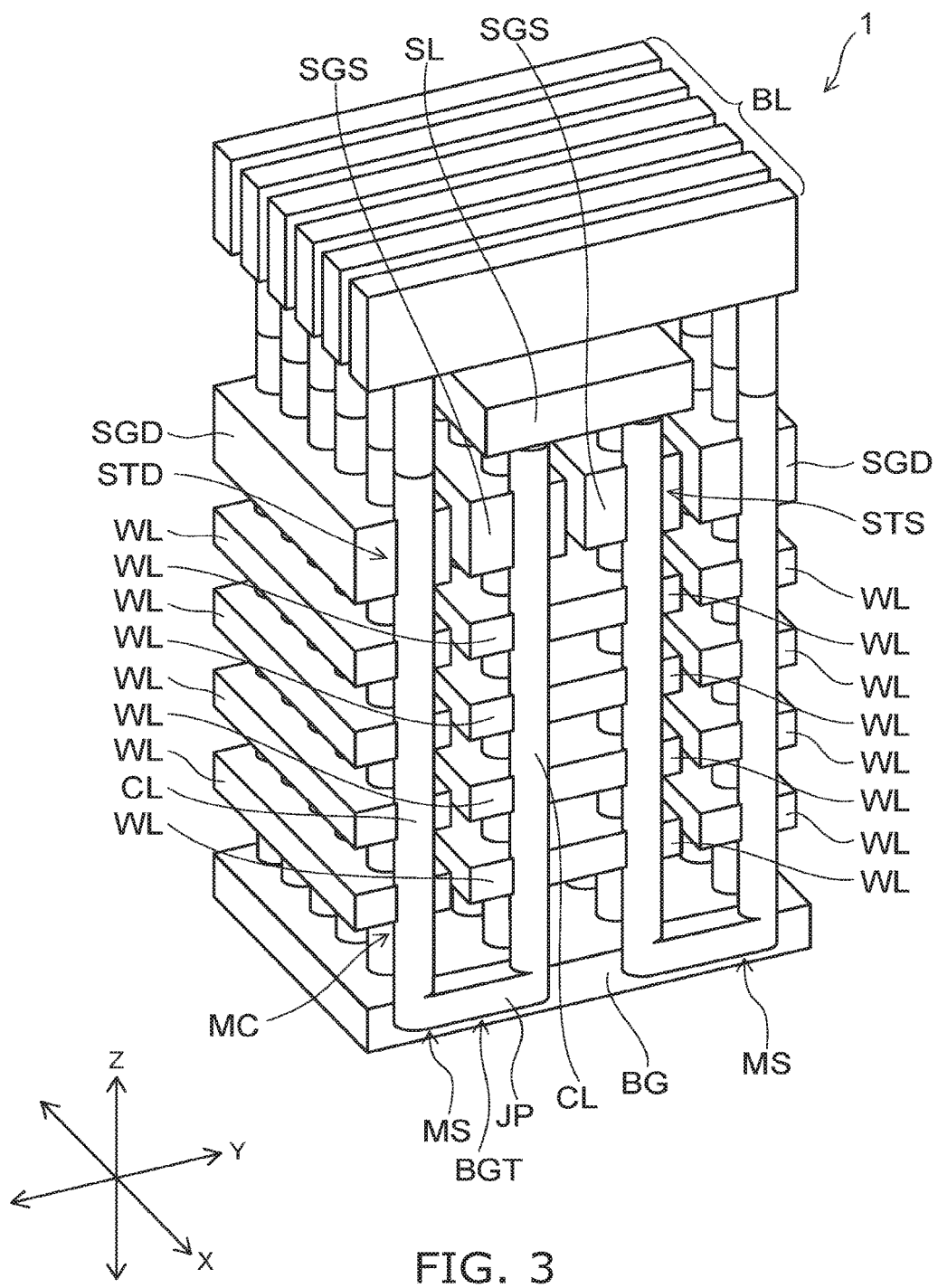
FIG. 3 is a schematic perspective view of a memory cell array of the embodiment.

FIG. 3 is a schematic perspective view of the memory cell array 1. Note that, in FIG. 3, to clearly show the figure, an interlayer insulating layer, an insulating separation film, and the like are not shown.

In FIG. 3, two directions that are orthogonal to each other are represented as an X-direction and a Y-direction. A direction that is orthogonal to the X-direction and the Y-direction (an XY plane) and in which a plurality of layers of electrode layers WL are stacked is represented as Z-direction (a stacking direction).

Figure 4:
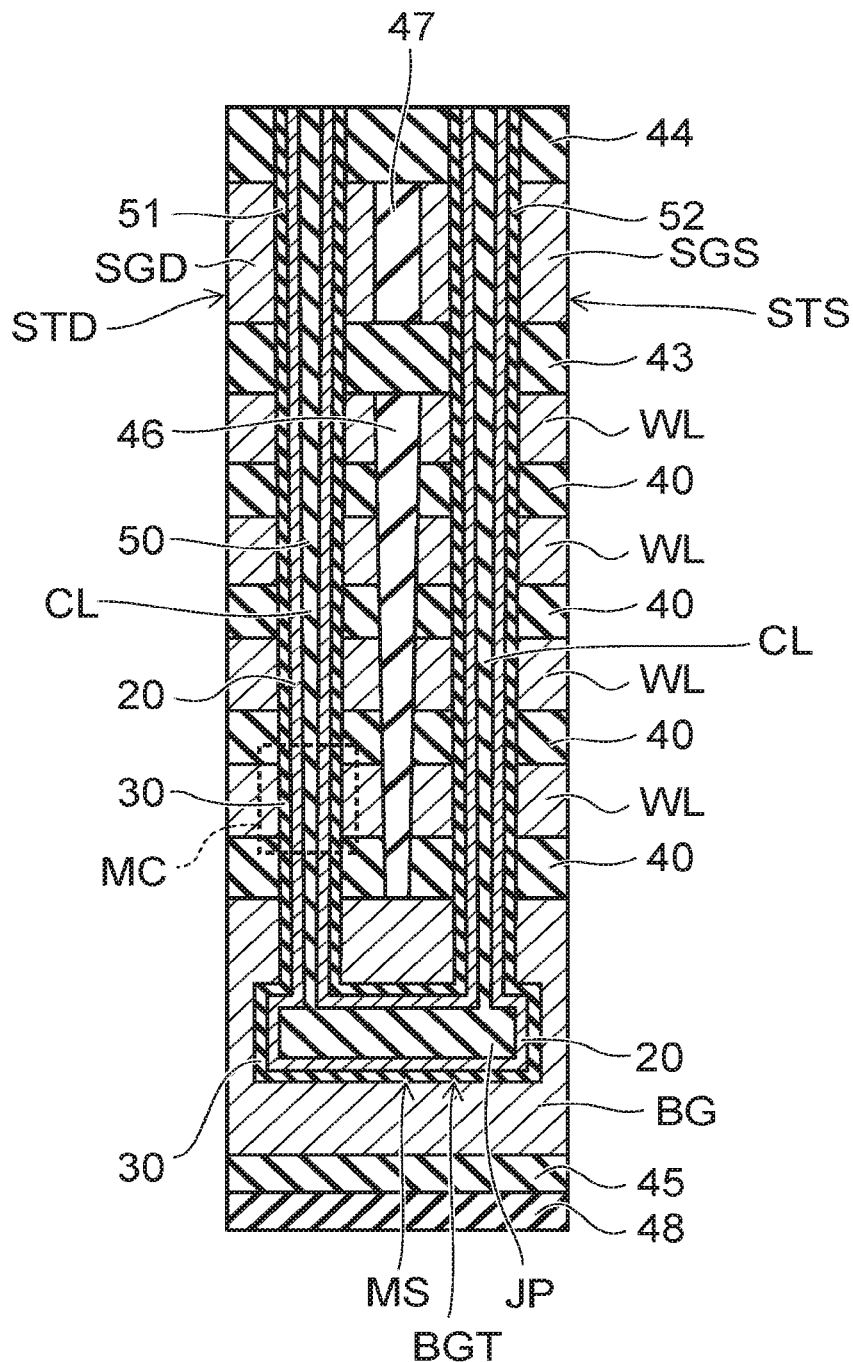
FIG. 4 is a schematic sectional view of a memory string of the embodiment.

The memory cell array 1 includes a plurality of memory strings MS. FIG. 4 is a schematic sectional view of the memory string MS. FIG. 4 shows a cross section parallel to a YZ plane in FIG. 3.

The memory cell array 1 includes a stacked body including a plurality of electrode layers WL and a plurality of insulating layers 40. The electrode layers WL and the insulating layers 40 are alternately stacked. The stacked body is provided on a back gate BG functioning as a lower gate layer. Note that the number of layers of the electrode layers WL shown in the figure is an example. The number of layers of the electrode layers WL may be any number.

Figure 6:
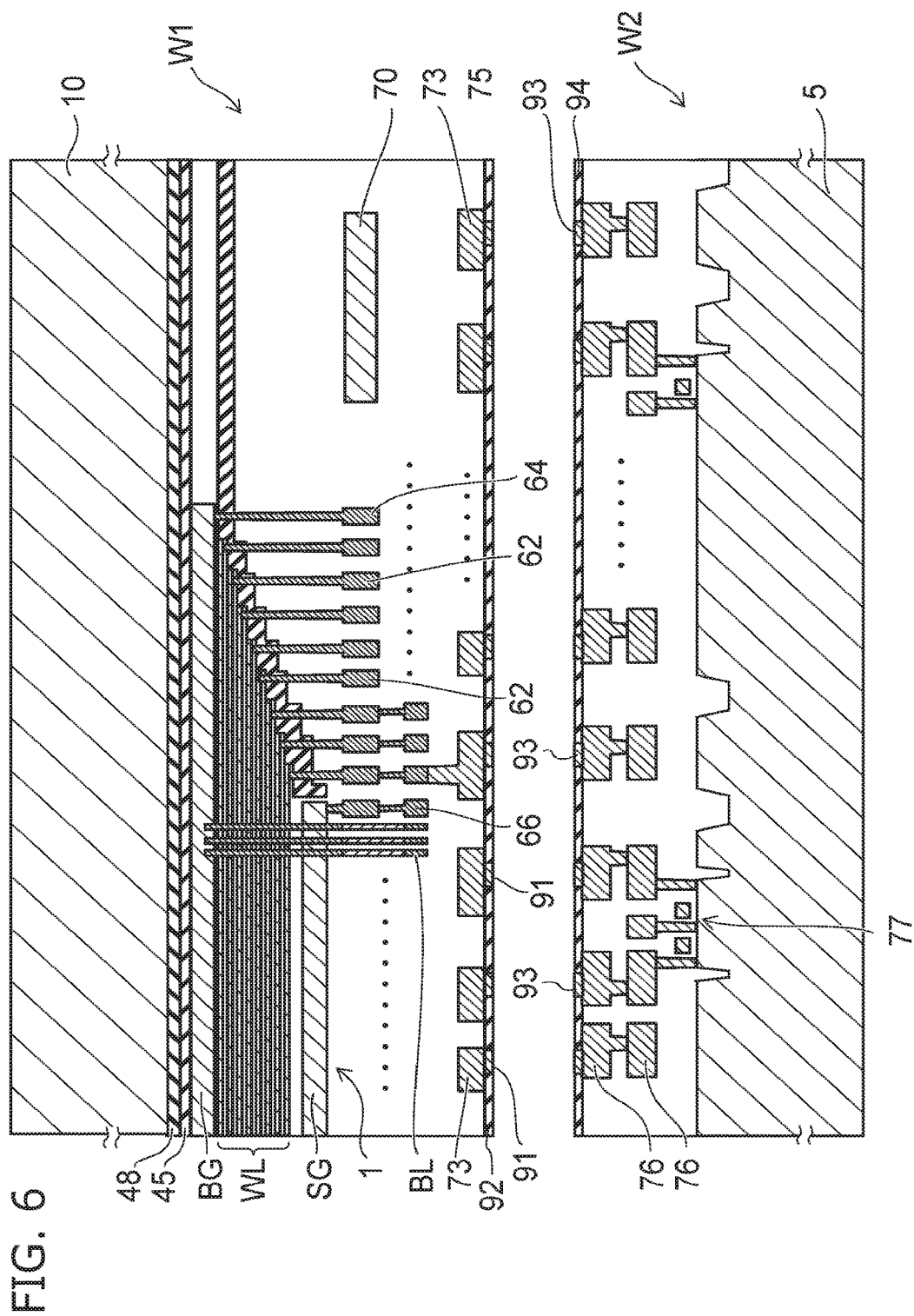
FIG. 6 and FIG. 7 are schematic sectional views showing a method for manufacturing the semiconductor memory device of the embodiment.

As shown in FIG. 6 referred to below, the back gate BG is provided on a first substrate 10 via insulating films 48 and 45. After an array wafer W1 and a circuit wafer W2 are stuck together, the first substrate is removed.

The back gate BG and the electrode layers WL are layers containing silicon as a main component. Further, the back gate BG and the electrode layers WL contain, for example, boron as impurities for imparting conductivity to a silicon layer. The electrode layers WL may contain metal silicide. Alternatively, the electrode layers WL are metal layers.

The insulating layers 40 mainly contain, for example, silicon oxide. For example, the insulating film 48 is a silicon oxide film and the insulating film 45 is a silicon nitride film.

One memory string MS is formed in a U shape including a pair of a columnar sections CL extending in the Z-direction and a connecting section JP that couples respective lower ends of the pair of columnar sections CL. The columnar sections CL are formed in, for example, a columnar or elliptical columnar shape, pierce through the stacked body, and reach the back gate BG.

A drain-side select gate SGD is provided at an upper end portion of one of the pair of columnar sections CL in the U-shaped memory string MS. A source-side select gate SGS is provided at the other upper end portion. The drain-side select gate SGD and the source-side select gate SGS are provided on the electrode layer WL of the top layer via an interlayer insulating layer 43.

The drain-side select gate SGD and the source-side select gate SGS are layers containing silicon as a main component. Further, the drain-side select gate SGD and the source-side select gate SGS contain, for example, boron as impurities for imparting conductivity to a silicon layer.

The drain-side select gate SGD and the source-side select gate SGS functioning as an upper select gate and the back gate BG functioning as a lower select gate are thicker than one layer of the electrode layer WL.

The drain-side select gate SGD and the source-side select gate SGS are separated in the Y-direction by an insulating separation film 47. A stacked body under the drain-side select gate SGD and a stacked body under the source-side select gate SGS are separated in the Y-direction by an insulating separation film 46. That is, a stacked body between the pair of columnar sections CL of the memory string MS is separated in the Y-direction by the insulating separation films 46 and 47.

On the source-side select gate SGS, a source line (e.g., a metal film) SL is provided via an insulating layer 44. A plurality of bit lines (e.g., metal films) BL shown in FIG. 1 are provided on the drain-side select gate SGD and the source line SL via the insulating layer 44. The bit lines BL extend in the Y-direction.

Figure 5:
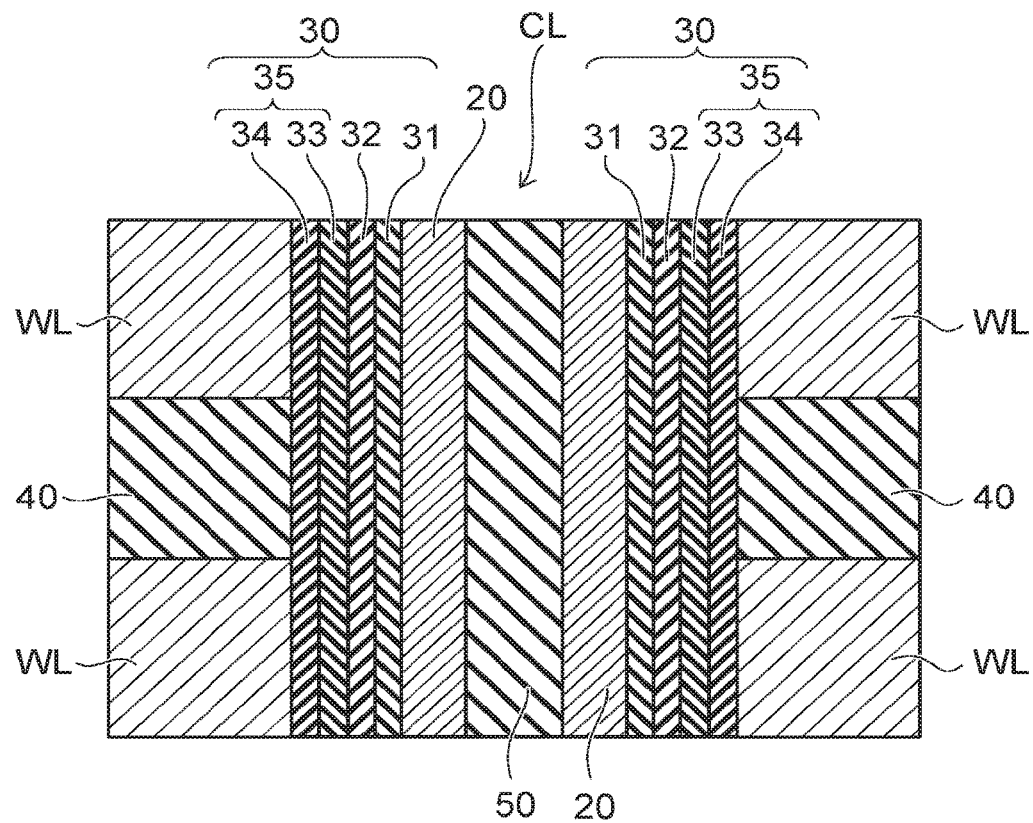
FIG. 5 is a schematic sectional view of a memory cell of the embodiment.

FIG. 5 is an enlarged schematic sectional view of a part of the columnar section CL.

The columnar section CL is formed in a U-shaped memory hole formed in the stacked body including the plurality of layers of the electrode layers WL, the plurality of layers of the insulating layers 40, and the back gate BG. In the memory hole, a channel body 20 functioning as a semiconductor body is provided. The channel body 20 is, for example, a silicon film. The impurity concentration of the channel body 20 is lower than the impurity concentration of the electrode layers WL.

A memory film 30 is provided between the inner wall of the memory hole and the channel body 20. The memory film 30 includes a block insulating film 35, a charge storage film 32, and a tunnel insulating film 31.

The block insulating film 35, the charge storage film 32, and the tunnel insulating film 31 are provided in order from the electrode layers WL side between the electrode layers WL and the channel body 20.

The channel body 20 is provided in a cylindrical shape extending in the stacking direction of the stacked body. The memory film 30 is provided in a cylindrical shape to surround the outer circumferential surface of the channel body 20 while extending in the stacking direction of the stacked body. The electrode layers WL surround the channel body 20 via the memory film 30. A core insulating film 50 is provided on the inner side of the channel body 20. The core insulating film 50 is, for example, a silicon oxide film.

The block insulating film 35 is in contact with the electrode layers WL. The tunnel insulating film 31 is in contact with the channel body 20. The charge storage film 32 is provided between the block insulating film 35 and the tunnel insulating film 31.

The channel body 20 functions as a channel in memory cells MC. The electrode layers WL function as control gates of the memory cells. The charge storage film 32 functions as a data memory layer that accumulates charges injected from the channel body 20. That is, the memory cells MC having a structure in which the control gates surround the channel are formed in crossing portions of the channel body 20 and the electrode layers WL.

The semiconductor memory device of the embodiment is a nonvolatile semiconductor memory device that can electrically freely perform erasing and writing of data and can retain stored content even if a power supply is turned off.

The memory cell MC is, for example, a memory cell of a charge trap type. The charge storage film 32 includes a large number of trap sites that trap charges. The charge storage film 32 is, for example, a silicon nitride film.

The tunnel insulating film 31 functions as a potential barrier when charges are injected into the charge storage film 32 from the channel body 20 or when charges stored in the charge storage film 32 diffuse to the channel body 20. The tunnel insulating film 31 is, for example, a silicon oxide film.

Alternatively, as the tunnel insulating film, a stacked film (an ONO film) having a structure in which a silicon nitride film is sandwiched by a pair of silicon oxide films may be used. When the ONO film is used as the tunnel insulating film, compared with a single layer of a silicon oxide film, an erasing operation can be performed in a low electric field.

The block insulating film 35 prevents the charges stored in the charge storage film 32 from diffusing to the electrode layers WL. The block insulating film 35 includes a cap film 34 provided in contact with the electrode layers WL and a block film 33 provided between the cap film 34 and the charge storage film 32.

The block film 33 is, for example, a silicon oxide film. The cap film 34 is a film having a dielectric constant higher than the dielectric constant of silicon oxide and is, for example, a silicon nitride film. By providing such a cap film 34 in contact with the electrode layers WL, it is possible to suppress back tunnel electrons injected from the electrode layers WL during erasing. That is, by using a stacked film of the silicon oxide film and the silicon nitride film as the block insulating film 35, it is possible to improve a charge blocking property.

As shown in FIGS. 3 and 4, a drain-side select transistor STD is provided at the upper end portion of one of the pair of columnar sections CL in the U-shaped memory string MS. A source-side select transistor STS is provided at the other upper end portion.

The memory cell MC, the drain-side select transistor STD, and the source-side select transistor STS are vertical transistors in which an electric current flows in the stacking direction of the stacked body (the Z-direction).

The drain-side select gate SGD functions as a gate electrode (a control gate) of the drain-side select transistor STD. An insulating film 51 (FIG. 4) functioning as a gate insulating film of the drain-side select transistor STD is provided between the drain-side select gate SGD and the channel body 20. The channel body 20 of the drain-side select transistor STD is connected to the bit line BL above the drain-side select gate SGD.

The source-side select gate SGS functions as a gate electrode (a control gate) of the source-side select transistor STS. An insulating film 52 (FIG. 4) functioning as a gate insulating film of the source-side select transistor STS is provided between the source-side select gate SGS and the channel body 20. The channel body 20 of the source-side select transistor STS is connected to the source line SL above the source-side select gate SGS.

A back gate transistor BGT is provided in the connecting section JP of the memory string MS. The back gate BG functions as a gate electrode (a control gate) of the back gate transistor BGT. The memory film 30 provided in the back gate BG functions as a gate insulating film of the back gate transistor BGT.

A plurality of memory cells MC including the electrode layers WL of the respective layers as control gates are provided between the drain-side select transistor STD and the back gate transistor BGT. Similarly, a plurality of memory cells MC including the electrode layers WL of the respective layers as control gates are also provided between the back gate transistor BGT and the source-side select transistor STS.

The plurality of memory cells MC, the drain-side select transistor STD, the back gate transistor BGT, and the source-side select transistor STS are connected in series through the channel body 20 and configures U-shaped one memory string MS. The plurality of the memory strings MS are arrayed in the X-direction and the Y-direction, whereby the plurality of memory cells MC are three-dimensionally provided in the X-direction, the Y-direction, and the Z-direction.

The electrode layers WL are separated into a plurality of blocks in the Y-direction and extend in the X-direction.

In FIG. 1, a region at the end in the X-direction in the memory cell array 1 is shown. A step structure section 96 of the electrode layers WL is formed at an end of a memory cell array region 81 where the plurality of memory cells MC are disposed.

In the step structure section 96, the end portions in the X-direction of the electrode layers WL of the respective layers are formed in a step shape. In the step structure section 96, a plurality of contact plugs 61 connected to the electrode layers WL of the respective layers formed in the step shape are provided. The contact plugs 61 are connected to the electrode layers WL of the respective layers in the step shape piercing through an interlayer insulating layer 69.

In the step structure section 96, the back gate BG is connected to a contact plug 63. A select gate SG (the drain-side select gate SGD and the source-side select gate SGS) is connected to a contact plug 65.

The contact plugs 61 connected to the electrode layers WL are connected to word interconnection layers 62. The contact plug 63 connected to the back gate BG is connected to a back gate interconnection layer 64. The contact plug 65 connected to the select gate SG is connected to a select gate interconnection layer 66.

The word interconnection layers 62, the back gate interconnection layer 64, and the select gate interconnection layer 66 are provided in the same layer. The source line SL shown in FIG. 3 is also provided in the same layer as the word interconnection layers 62, the back gate interconnection layer 64, and the select gate interconnection layer 66.

The word interconnection layers 62, the back gate interconnection layer 64, the select gate interconnection layer 66, and the source line SL are formed by patterning of the same material layer (e.g., metal layer). Therefore, the word interconnection layers 62, the back gate interconnection layer 64, the select gate interconnection layer 66, and the source line SL are simultaneously formed in the same layer formed of the same material and at the same thickness.

The word interconnection layers 62 are further connected to surface layer interconnection layers 73, which are formed on the side of a bonding surface to the circuit chip 200 of the array chip 100, via other plugs and interconnection layers.

The back gate interconnection layer 64, the select gate interconnection layer 66, and the source line SL are also connected to the surface layer interconnection layers 73 via other plugs and interconnection layers.

The channel bodies 20 of the columnar sections CL and the bit lines BL are connected via plugs 67. Further, the bit lines BL are connected to the surface layer interconnection layers 73 via other plugs and interconnection layers.

The array chip 100 includes a memory-side interconnection layer for electrically connecting the memory cell array 1 to the circuit chip 200. The memory-side interconnection layer is formed as a multilayer interconnect including the word interconnection layers 62, the back gate interconnection layer 64, the select gate interconnection layer 66, and the surface layer interconnection layers 73.

The surface layer interconnection layers 73 are connected to circuit-side interconnection layers 76 of the circuit chip 200 via bonding metals 74a and 74b. The circuit chip 200 includes a substrate 5. The substrate 5 is, for example, a silicon substrate.

A control circuit is formed on a circuit formation surface (a surface facing the array chip 100 side) of the substrate 5. The control circuit is formed as a semiconductor integrated circuit including a transistor 77. The transistor 77 has a Metal-Oxide-Semiconductor Field Effect Transistor (MOSFET) structure including, for example, a gate electrode 78 and source/drain regions. The source/drain regions of the MOSFET are connected to the circuit-side interconnection layers 76 via plugs 79.

The circuit-side interconnection layers 76 are formed on the circuit formation surface as a multilayer interconnect via an interlayer insulating film 80.

The bonding metals 74a and 74b are provided between the surface layer interconnection layers 73 of the array chip 100 and interconnection layers of uppermost layers (interconnection layers of top layers viewed from the substrate 5) of the circuit-side interconnection layers 76 of the circuit chip 200. The bonding metals 74a and 74b are, for example, copper or a copper alloy containing copper as a main component.

The surface layer interconnection layers 73 of the array chip 100 and the circuit-side interconnection layers 76 of the top layer of the circuit chip 200 are bonded to the bonding metals 74a and 74b. An insulating film 75 is provided around the bonding metals 74a and 74b between the array chip 100 and the circuit chip 200. The insulating film 75 is a resin film or an inorganic film.

The array chip 100 and the circuit chip 200 are stuck together via the bonding metals 74a and 74b and the insulating film 75. The memory-side interconnection layer of the array chip 100 and the circuit-side interconnection layers 76 of the circuit chip 200 are electrically connected via the bonding metals 74a and 74b.

Therefore, the memory cell array 1 is connected to the control circuit of the circuit chip 200 via the memory-side interconnection layer, the bonding metals 74a and 74b, and the circuit-side interconnection layers 76.

According to the embodiment, an external connection electrode 71 is formed on the array chip 100 side. A pad 70 is provided in a region closer to an end than the step structure section 96 in the array chip 100.

For example, the pad 70 is formed by patterning of a metal layer (e.g., a tungsten layer) in forming the word interconnection layers 62, the back gate interconnection layer 64, the select gate interconnection layer 66, and the source line SL. Therefore, the pad 70 is formed in the same layer and formed of the same material and at the same thickness as the word interconnection layers 62, the back gate interconnection layer 64, the select gate interconnection layer 66, and the source line SL.

An external connection pad 72 is provided on the surface (the surface on the opposite side of the bonding surface to the circuit chip 200) of the array chip 100. The external connection electrode 71 is provided between the external connection pad 72 and the pad 70.

The pad 70 is electrically connected to the circuit-side interconnection layers 76 via the memory-side interconnection layer or separately-provided vias. Therefore, the control circuit formed in the circuit chip 200 is electrically connected to the external connection pad 72 via the pad 70 and the external connection electrode 71. The external connection pad 72 is connectable to a mounting substrate or other chips via, for example, a solder ball, a metal bump, or a bonding wire.

A plurality of the bonding metals 74a and 74b are disposed in a bonding section of the array chip 100 and the circuit chip 200. The plurality of bonding metals 74a and 74b mainly include a plurality of bit-line lead-out sections 74a electrically connected to the bit lines BL and a plurality of word-line lead-out sections 74b electrically connected to the electrode layers WL.

Figure 2:
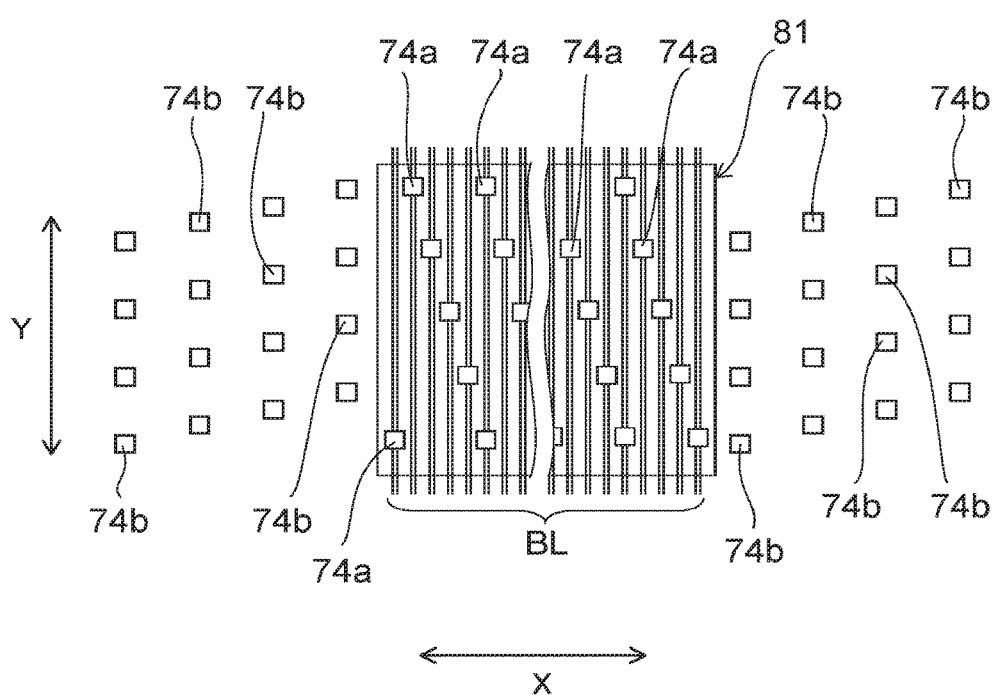
FIG. 2 is a schematic plan view showing an example of a layout of a bonding metal of the semiconductor memory device of the embodiment.

FIG. 2 is a schematic plan view showing a disposition relation of the bit-line lead-out sections 74a and the word-line lead-out sections 74b.

The bit-line lead-out sections 74a are disposed in a region overlapping, in the stacking direction, a memory cell array region 81 where the plurality of memory strings MS are disposed (a region below the memory cell array region 81 in FIG. 1).

The word-line lead-out sections 74b are disposed in a region overlapping, in the stacking direction, a region where the step structure section 96, the external connection electrode 71, and the like are formed further on the outer side than the memory cell array region 81. In FIG. 1, the plurality of word-line lead-out sections 74b are disposed in a region below the step structure section 96 and a region below the external connection electrode 71 (the pad 70).

Figure 7:
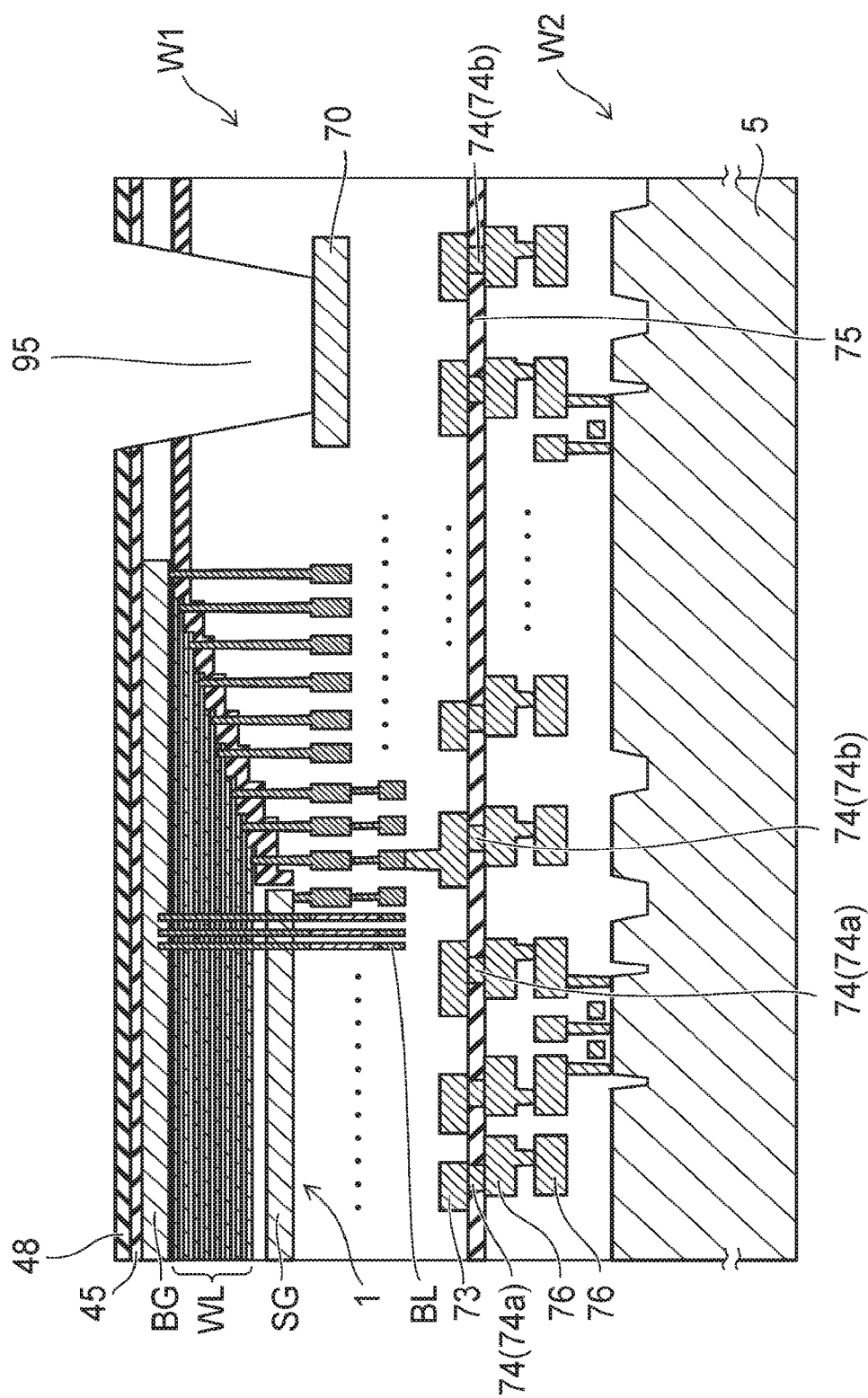

A method for manufacturing the semiconductor memory device of the embodiment is described with reference to FIGS. 6 and 7.

Components of the array chip 100 and components of the circuit chip 200 are respectively formed in wafer states.

In FIG. 6, the array wafer W1 and the circuit wafer W2 before being stuck together are shown.

The substrate 10 still remains on the array wafer W1 before being stuck. The back gate BG is formed on the substrate (e.g., a silicon substrate) 10 via the silicon oxide film 48 and the silicon nitride film 45. Further, the stacked body including the plurality of layers of the electrode layers WL and the select gate SG are stacked on the back gate BG.

After the stacked body is formed, the memory strings MS, the step structure section 96, and the like are formed. Further, the memory-side interconnection layer is formed. The pad 70 is also formed during the formation of the memory-side interconnection layer.

After the surface layer interconnection layers 73 of the memory-side interconnection layer is formed, first bonding metals 91 and a first insulating film 92 are formed on a bonding surface (the surface on the opposite side of the substrate 10) of the array wafer W1. The first bonding metals 91 are bonded to the surface layer interconnection layers 73. The first insulating film 92 is formed between the first bonding metal 91 and the first bonding metal 91 (around the first bonding metals 91). The surfaces (bonding surfaces) of the first bonding metals 91 are exposed from the first insulating film 92.

Components of the circuit wafer W2 are formed on the substrate (e.g., a silicon substrate) 5 different from the substrate 10 of the array wafer W1.

After the control circuit (the semiconductor integrated circuit) including the transistor 77 is formed on the surface of the substrate 5, the circuit-side interconnection layers 76 are formed via the interlayer insulating layer 80.

Second bonding metals 93 and a second insulating film 94 are formed on a bonding surface (the surface on the opposite side of the substrate 5) of the circuit wafer W2. The second bonding metals 93 are bonded to the circuit interconnection layers 76 of the top layers. The second insulating film 94 is formed between the second bonding metal 93 and the second bonding metal 93 (around the second bonding metals 93). The surfaces (bonding surfaces) of the second bonding metals 93 are exposed from the second insulating film 94.

The array wafer W1 and the circuit wafer W2 are bonded wafer-to-wafer by applying mechanical pressure with the surfaces on the opposite sides of the substrates 10 and 5 facing to each other.

The first bonding metals 91 and the second bonding metals 93 are, for example, copper or a copper alloy. The first bonding metals 91 and the second bonding metals 93 are bonded to each other to be integral bonded metals 74 as shown in FIG. 7. The first insulating film 92 and the second insulating film 94 are bonded to be an integral insulating film 75.

After the array wafer W1 and the circuit wafer W2 are stuck together, the substrate 10 of the array wafer W1 is removed. For example, the entire substrate 10 is removed by wet etching using nitrohydrofluoric acid.

On a surface from which the substrate 10 is removed, the insulating films (the silicon oxide film 48 and the silicon nitride film 45) formed on the substrate 10 remain as a passivation film that protects the surface of the array wafer W1 (the array chip 100).

After the substrate 10 is removed, a via 95 reaching the pad 70 is formed from the side of the surface from which the substrate 10 is removed (the surface of the silicon oxide film 48). In the via 95, as shown in FIG. 1, the external connection electrode 71 is embedded.

Alternatively, the external connection electrode 71 may be formed on the bottom section of the via 95 (the upper surface of the pad 70) and the sidewall of the via 95 while leaving a space in the via 95.

For driving of the memory cell array 1, a high voltage of, for example, approximately 20 V is sometimes required. In order to maintain a breakdown voltage of the transistor 77 of the control circuit (a CMOS circuit) (in order to extend a depletion layer), it is desired to leave, on the circuit chip 200 side, the substrate (the silicon substrate) 5 having thickness of approximately 10 to 20 µm. The thick substrate 5 functions as a support body for the semiconductor memory device.

In connecting the control circuit to an external circuit, it is conceivable to form Through Silicon Vias (TSVs), which pierce through the substrate 5, from the rear surface side of the substrate 5 and connect the TSVs to the circuit-side interconnection layers 76. However, costs and a treatment time for etching of the thick substrate 5 are large. Further, in order to prevent a short circuit of the silicon substrate 5 and intra-via electrodes, a process for forming insulating films on via sidewalls is also necessary.

On the other hand, according to the embodiment, the via 95 (FIG. 7) is formed on the side of the array chip 100 from which the substrate 10 is removed. Since the thickness of the array chip 100 is approximately several micrometers, a deep etching process for piercing through a thick substrate of several tens micrometers is unnecessary. It is possible to attain a reduction in costs.

By removing the substrate 10 of the array wafer W1 with wet etching, stress applied to the memory cell array 1 is not generated unlike substrate removal by grinding. Therefore, yield and reliability are improved.

A method for forming a control circuit on a substrate and forming a memory cell array on the control circuit is also conceivable. However, in some case, a heat process of 900° C. or higher is necessary for the formation of the three-dimensional memory cell array 1. If the control circuit is formed under the cell array in advance, there is a concern about problems such as diffusion of impurities of a transistor and heat resistance of a metal contact.

Further, according to an increase in speed of an interface in future, improvement of the performance of the transistor is desired. It is also likely that it is necessary to form the control circuit using a process with low heat resistance in which salicide or the like is used.

On the other hand, according to the embodiment, since the array chip 100 including the memory cell array 1 and the circuit chip 200 including the control circuit are formed by separate wafer processes, high heat treatment for the memory cell array 1 does not act on the control circuit. Therefore, it is possible to form both of the memory cell array 1 and the control circuit in structures with high reliability.

In a structure in which a control circuit and a memory cell array are sequentially formed on a substrate, bit lines are formed further on the upper side than a stacked body when viewed from the substrate. Therefore, in connecting the bit lines to the control circuit, after the bit lines are led out to an outer side region of a memory cell array region via an interconnection layer formed on the bit lines, deep contact plugs are connected to the control circuit on the substrate surface from the lead-out interconnection layer. This could be a cause of an increase in a chip area because of a region for routing of interconnects. There is also a concern that the bit lines are substantially long, a bit line capacity increases, and operation speed is affected. There is the same concern about routing of electrode layers (word lines).

On the other hand, according to the embodiment, the side where the bit lines BL, the source line SL, the word interconnection layers 62, and the like are formed is bonded to the circuit chip 200 via the bonding metals 74*a* and 74*b*. Therefore, interconnects only have to be directly led out downward (toward the bonding surface side).

For example, as described with reference to FIG. 2, the bit-line lead-out sections 74*a* are not led out to (not disposed on) the outer side of the memory cell array region 81 and are disposed in the overlapping region below the memory cell array region 81.

Therefore, it is possible to suppress an increase in a interconnection length and an interconnect formation region for connecting the bit lines BL, the source line SL, the word interconnection layers 62, and the like to the control circuit and suppress an operation delay and an increase in a chip area.

As described above, according to the embodiment, it is possible to attain an increase in the capacity of the memory cells and improvement of reliability with an inexpensive process. Further, it is possible to realize refining and an increase in speed of the control circuit.

Figure 8:
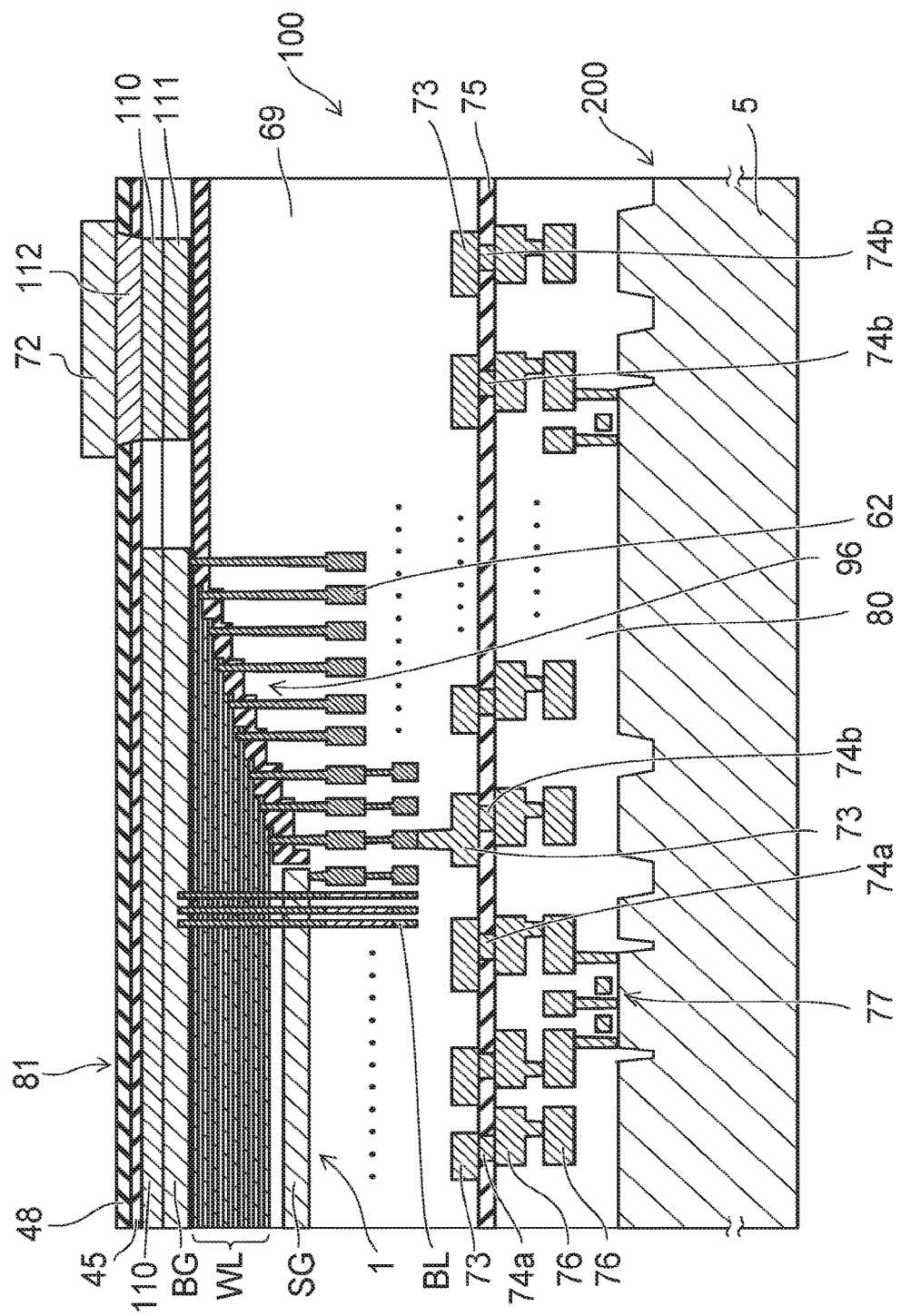
FIG. 8 is a schematic sectional view of the semiconductor memory device of the embodiment.

The pad connected to the external connection electrode may be formed in the same layer as the back gate BG as shown in FIG. 8.

Polycrystalline silicon is often used in the back gate BG. Therefore, in order to reduce the resistance of the pad, it is desired to stack a layer 110 containing metal such as a metal silicide layer or a metal layer on the back gate BG.

The layer 110 containing the metal is formed on the substrate 10 via the insulating films 48 and 45 in a wafer stage. The back gate BG is formed on the layer 110. The layer 110 containing the metal and the back gate BG are left as pads 110 and 111 in a region further on the outer side than the step structure section 96 by patterning.

After the substrate 10 is removed, a via reaching the pad 110 is formed from the surface side of the array wafer W1. An external connection electrode 112 is formed in the via.

Compared with the structure shown in FIG. 1 in which the pad is formed in the same layer as the word interconnection layer 62 and the like, the via may be shallow. It is possible to realize a further reduction in costs and further improvement of yield.

Figure 9:
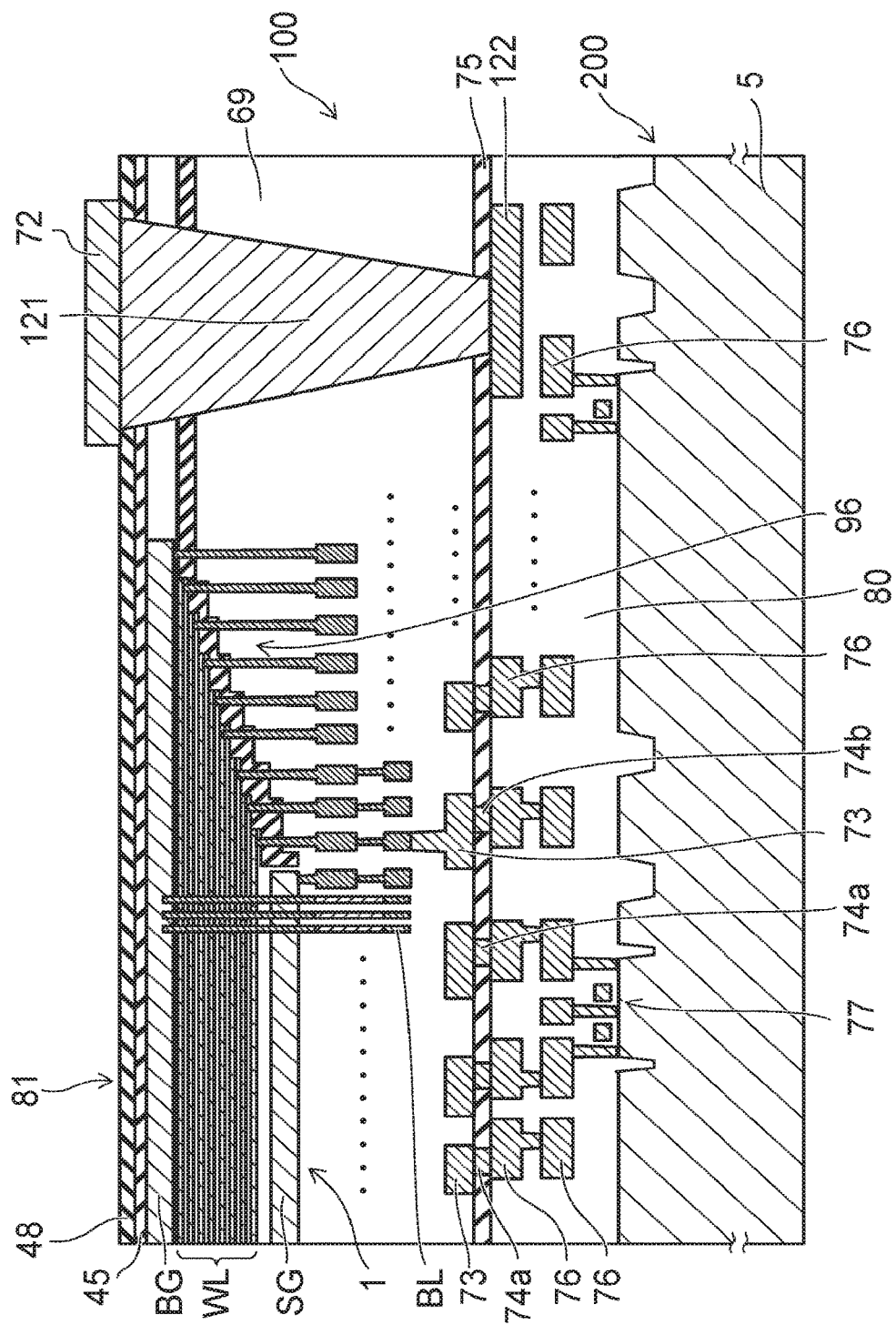
FIG. 9 is a schematic sectional view of the semiconductor memory device of the embodiment.

The pad is not limited to be formed in the array chip 100. As shown in FIG. 9, a part of the circuit-side interconnection layer 76 of the circuit chip 200 may be used as a pad 122. For example, a interconnection layer of a top layer of the circuit-side interconnection layer 76 viewed from the substrate 5 is formed as the pad 122.

After the substrate 10 of the array wafer W1 is removed, a via reaching the pad 122 is formed from the surface side of the array wafer W1 in a region further on the outer side than the step structure section 96. An external connection electrode 121 is formed in the via. The external connection electrode 121 is connected to the circuit-side interconnection layer 76 not via the memory-side interconnection layer.

Figure 10:
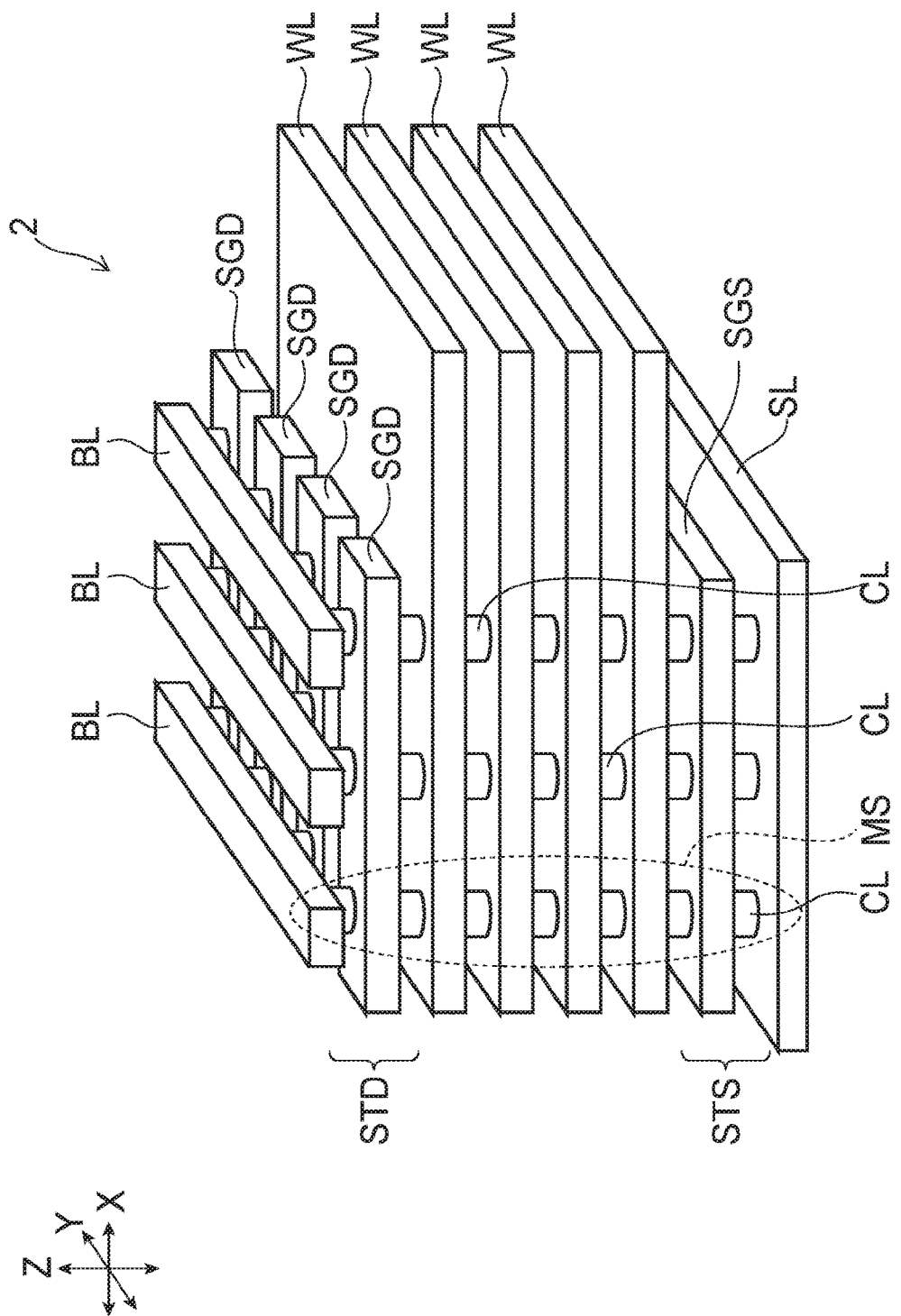
FIG. 10 is a schematic perspective view of a memory cell array of the embodiment.

FIG. 10 is a schematic perspective view of a memory cell array 2 of another example of the semiconductor memory device of the embodiment. Note that, in FIG. 10, as in FIG. 3, to clearly show the figure, insulating layers and the like are not shown.

The source layer SL is provided on the opposite side of the bonding surface to the circuit chip 200. The source-side select gate (the lower select gate layer) SGS is provided on the source layer SL via an insulating layer.

An insulating layer is provided on the source-side select gate SGS. A stacked body obtained by alternately stacking the plurality of electrode layers WL and a plurality of insulating layers is provided on the insulating layer.

An insulating layer is provided on the electrode layer WL of a most distant layer when viewed from the source layer SL. The drain-side select gate (the upper select gate layer) SGD is provided on the insulating layer.

The columnar sections CL extending in the Z-direction are provided in the stacked body. That is, the columnar sections CL pierce through the drain-side select gate SGD, the plurality of layers of the electrode layers WL, and the source-side select gate SGS. One end of the channel body 20 in the columnar section CL is connected to the bit line BL. The other end of the channel body 20 is connected to the source line SL.

The source line SL is formed on the substrate. The source-side select gate SGS, the stacked body including the plurality of layers of the electrode layers WL, the drain-side select gate SGD, and the bit lines BL are formed in order on the source line SL. An array wafer in which the source line SL, the source-side select gate SGS, the stacked body including the plurality of layers of the electrode layers WL, the drain-side select gate SGD, and the bit lines BL is stuck to the circuit wafer W2 with the bit lines BL side opposed to the circuit wafer W2.

After the sticking, the substrate is removed. A via is formed from a surface side from which the substrate is removed. An external connection electrode is formed in the via.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a first structure including a substrate, a control circuit disposed on the substrate, and a first interconnection disposed on the control circuit; and
   a second structure disposed on the first structure, the second structure including a second interconnection, a bit line, a semiconductor body, a plurality of conductive layers configured as word lines, and a charge storage portion, the second interconnection electrically connected to the first interconnection, the bit line connected to the second interconnection, the bit line being disposed between the first structure and the conductive layers, the semiconductor body connected to the bit line and extending in a first direction perpendicular to the substrate, the conductive layers arrayed stacked in the first direction, the charge storage portion disposed between one of the conductive layers and the semiconductor body.

2. The device according to claim 1, wherein
   the first structure includes a third interconnection disposed in same layer as the first interconnection, and
   the second structure includes a via electrically connected to the third interconnection and penetrating through the second structure.

3. The device according to claim 2, wherein the via includes a pad at an upper side.

4. The device according to claim 1, wherein the first structure is attached to the second structure with an insulating film interposed.

5. The device according to claim 4, further comprising a bonding metal directly connected to the first interconnection and the second interconnection, the insulating film provided around the bonding metal.

6. The device according to claim 1, further comprising a bonding metal directly connected to the first interconnection and the second interconnection.

7. The device according to claim 6, wherein the bonding metal is copper or copper alloy containing copper as a main component.

8. A semiconductor memory device comprising:
   a substrate;
   a control circuit disposed on the substrate;
   a first interconnection disposed on the control circuit;
   a second interconnection disposed on the first interconnection and electrically connected to the first interconnection;
   a bit line connected to the second interconnection;
   a semiconductor body connected to the bit line and extending in a first direction perpendicular to the substrate;
   a plurality of conductive layers configured as word lines stacked in the first direction; and
   a charge storage portion disposed between one of the conductive layers and the semiconductor body,
   the bit line being disposed between the first interconnection and the conductive layers.

9. The device according to claim 8, further comprising
   a third interconnection disposed in same layer as the first interconnection, and
   a via extending in the first direction and electrically connected to the third interconnection.

10. The device according to claim 9, wherein the via includes a pad at an upper side.

11. The device according to claim 8, wherein the first interconnection is attached to the second interconnection with an insulating film interposed.

12. The device according to claim 11, further comprising a bonding metal directly connected to the first interconnection and the second interconnection, the insulating film provided around the bonding metal.

13. The device according to claim 8, further comprising a bonding metal directly connected to the first interconnection and the second interconnection.

14. The device according to claim 13, wherein the bonding metal is copper or copper alloy containing copper as a main component.

* * * * *